(12) United States Patent
Tai et al.

(10) Patent No.: US 7,576,975 B2
(45) Date of Patent: Aug. 18, 2009

(54) DISPLAY DEVICE HAVING TRANSPARENT PROTECTION STRUCTURE

(75) Inventors: Lone-Wen Tai, Taipei Hsien (TW); Zi-Li Wu, Shenzhen (CN); Jun Dai, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 88 days.

(21) Appl. No.: 11/940,325

(22) Filed: Nov. 15, 2007

(65) Prior Publication Data

US 2008/0285220 A1    Nov. 20, 2008

(30) Foreign Application Priority Data

May 18, 2007    (CN) .................... 2007 1 0200640

(51) Int. Cl.
G06F 1/16    (2006.01)
(52) U.S. Cl. ................................. 361/679.21
(58) Field of Classification Search ............. 361/679.21
See application file for complete search history.

(56) References Cited

U.S. PATENT DOCUMENTS

| | | | | |
|---|---|---|---|---|
| 5,128,829 A | * | 7/1992 | Loew ...................... 361/679.3 |
| 5,555,157 A | * | 9/1996 | Moller et al. ............ 361/679.3 |
| 5,682,182 A | * | 10/1997 | Tsubosaka ................... 345/173 |
| 5,701,230 A | * | 12/1997 | Liang et al. ............ 361/679.27 |
| 5,737,183 A | * | 4/1998 | Kobayashi et al. ..... 361/679.58 |
| 5,796,575 A | * | 8/1998 | Podwalny et al. ....... 361/679.27 |
| 6,003,052 A | * | 12/1999 | Yamagata .............. 361/679.26 |
| 6,259,597 B1 | * | 7/2001 | Anzai et al. ............ 361/679.55 |
| 6,891,722 B2 | * | 5/2005 | Chen et al. ............. 361/679.55 |
| 7,016,184 B1 | * | 3/2006 | Oneyama et al. ....... 361/679.27 |
| 7,236,357 B2 | * | 6/2007 | Chen ..................... 361/679.55 |
| 7,292,434 B2 | * | 11/2007 | Chi ........................ 361/679.27 |
| 2001/0009498 A1 | * | 7/2001 | Oross et al. ................. 361/681 |

* cited by examiner

Primary Examiner—Lisa Lea-Edmonds
(74) Attorney, Agent, or Firm—Frank R. Niranjan

(57) ABSTRACT

An exemplary display device (10) includes a display module (11), a transparent protection structure (12), and a magnetic latch (13). The display module includes a housing (113) and a display panel (115) mounted in the housing. The housing defines a mounting hole (118). The transparent protection structure is detachably attached to the housing for protecting the display panel. The transparent protection structure defines a channel (123) corresponding to the mounting hole of the housing. The magnetic latch includes a first magnet (131) rotably disposed in the channel of the transparent protection structure and a second magnet (132) fixed in the mounting hole of the housing. The first magnet attracts the second magnet for fixing the transparent protection structure.

15 Claims, 8 Drawing Sheets

DISPLAY DEVICE HAVING TRANSPARENT PROTECTION STRUCTURE

BACKGROUND OF THE INVENTION

1. Field of the Invention

The present invention generally relates to a display device, and more particularly to a flat-panel display device having a transparent protection structure.

2. Discussion of the Related Art

Generally, the flat-panel display device may be a liquid crystal display device, a plasma display device, a field emission display device, an electroluminescent display panel device, etc. In a liquid crystal display device, a screen of the liquid crystal display is made of a delicate material that is easily scratched when cleaning the screen and/or rubbing the screen with a rough object.

In order to prevent the screen from being scratched, a protection structure such as a sturdy transparent plate is generally configured on a frame of the liquid crystal display device to protect the screen. The sturdy transparent plate is generally fixed to the screen by screws. However, the screws should be tightened one by one with an extra assembling tool, thus it is inconvenient to assemble the sturdy transparent plate onto the screen. In order to overcome the above-described shortcoming, the sturdy transparent plate is fixed to the screen by magnets. It is convenient to assemble the sturdy transparent plate to the screen by magnets. However, because of magnetic forces produced by the magnets, it is difficult to detach the sturdy transparent plate from the screen. When the sturdy transparent plate needs to be changed or cleaned, a relatively great force is required for detaching the sturdy transparent plate from the screen, thus the sturdy transparent plate is easily damaged when applying the relatively great force.

Therefore, a new display device is desired in order to overcome the above-described shortcomings.

SUMMARY

A display device includes a display module, a transparent protection structure, and a magnetic latch. The display module includes a housing and a display panel mounted in the housing. The housing defines a mounting hole. The transparent protection structure is detachably attached to the housing for protecting the display panel. The transparent protection structure defines a channel corresponding to the mounting hole of the housing. The magnetic latch includes a first magnet rotably disposed in the channel of the transparent protection structure and a second magnet fixed in the mounting hole of the housing. The first magnet attracts the second magnet for fixing the transparent protection structure.

Other novel features and advantages will become more apparent from the following detailed description, when taken in conjunction with the accompanying drawings.

BRIEF DESCRIPTION OF THE DRAWINGS

The components in the drawings are not necessarily drawn to scale, the emphasis instead being placed upon clearly illustrating principles of the present display panel device. Moreover, in the drawings, like reference numerals designate corresponding parts throughout several views, and all the views are schematic.

DETAILED DESCRIPTION OF THE EMBODIMENTS

Reference will now be made to the drawings to describe preferred embodiments of the present display device in detail.

Figure 1:
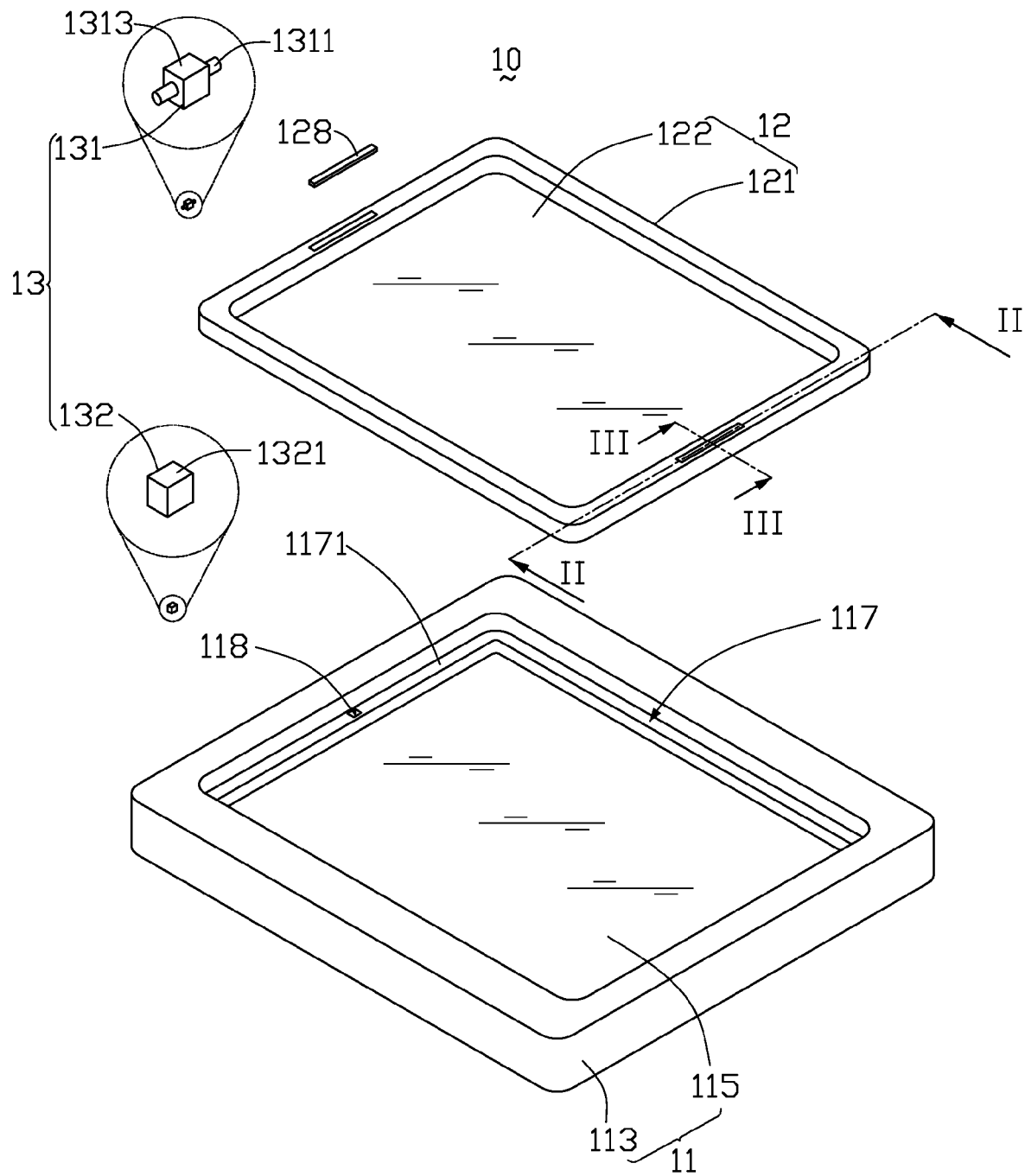
FIG. 1 is a partially exploded view of a display device in accordance with a first preferred embodiment of the present invention.
Figure 2:
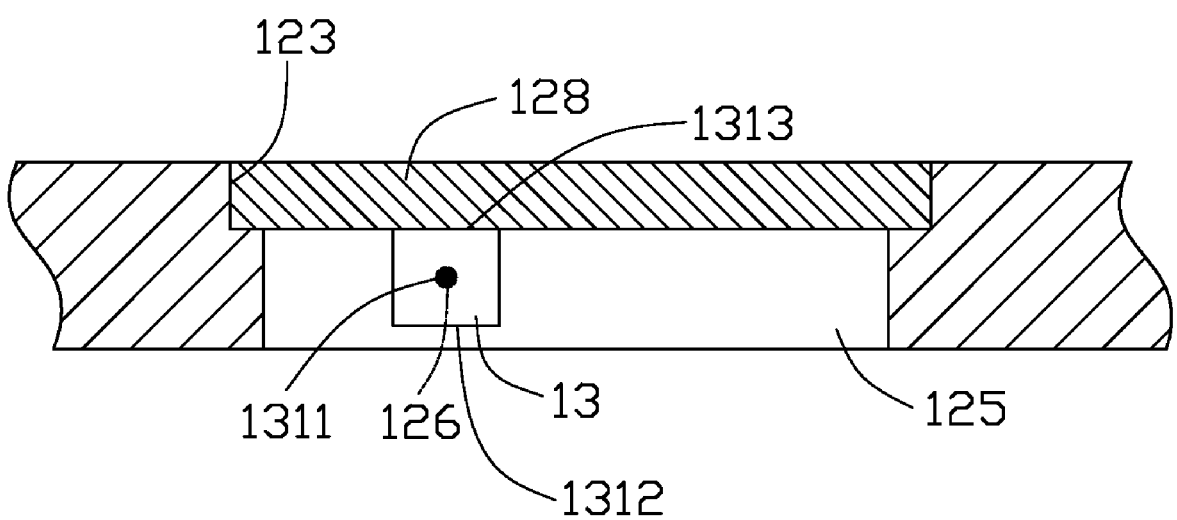
FIG. 2 is an enlarged, cross-sectional view of part of the display device of FIG. 1, taken along line II-II thereof.
Figure 3:
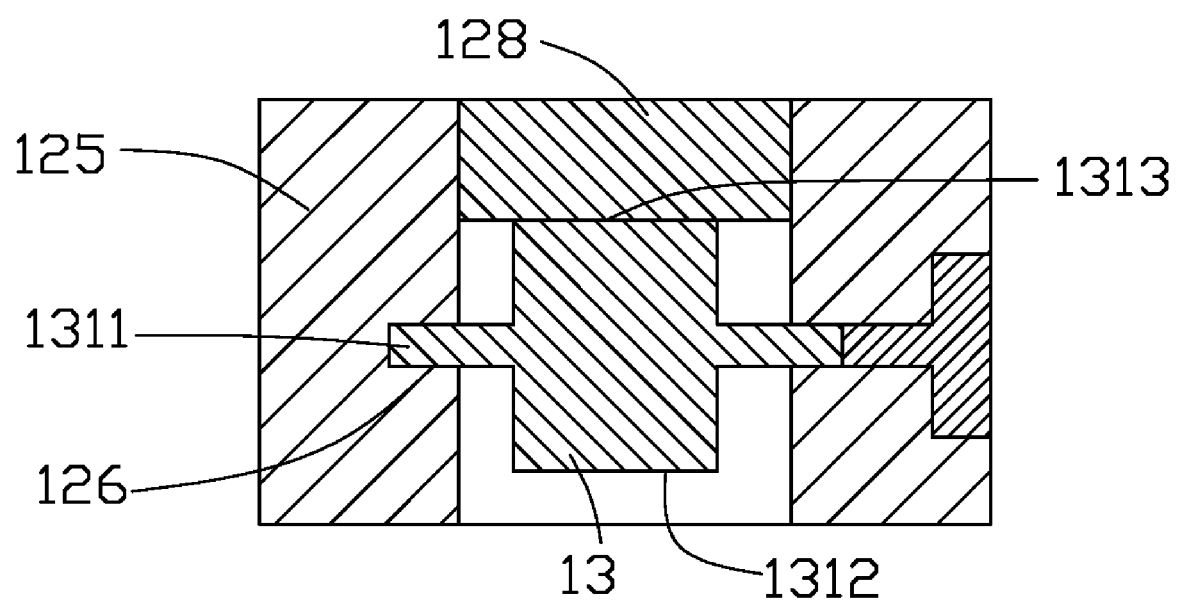
FIG. 3 is an enlarged, cross-sectional view of part of the display device of FIG. 1, taken along line III-III thereof.

Referring to FIGS. 1 through 3, a display device 10 according to a first embodiment is shown. The display device 10 includes a display module 11, a transparent protection structure 12, and a magnetic latch 13. The display module 11 includes a housing 113 and a display panel 115. The display panel 115 is a liquid crystal display panel mounted in the housing 113. The housing 113 is a rectangular housing. The housing 113 defines a stepped depression 117. The stepped depression 117 forms a ledge 1171 and a pair of mounting holes 118 are defined on the ledge at opposite sides of the stepped depression 117.

The transparent protection structure 12 is detachably mounted on a top of the ledge 1171 via the magnetic latch 13. The transparent protection structure 12 includes a frame 121, a transparent protection plate 122, and a pair of protection covers 128. The transparent protection plate 122 is used for protecting the display module 11 from damage by excessive external forces. The transparent protection plate 122 is made of a material selected from a group consisting of plastic, glass, and any suitable combination thereof. In the first embodiment, the transparent protection plate 122 is fixed to the frame 121 with double-sided adhesive tape, solid adhesive, or cured glue. The frame 121 is substantially rectangular. The frame 121 defines a pair of channels 123 at opposite sides of the transparent protection structure 12. Each of the channels 123 corresponds to one of the mounting holes 118 of the display module 11. A cross-section of each of the channel 123 is rectangular. The frame 121 includes two opposite sidewalls 125 disposed at opposite sides of the channel 123. The sidewalls 125 are parallel to each other, and each of the sidewalls 125 defines a pivot hole 126. Each of the protection covers 128 is a rectangular elastic cover configured for covering one corresponding channel 123.

The magnetic latches 13 includes a pair of first magnets 131 and a pair of second magnets 132. Each of the first magnets 131 is substantially a hexahedral magnet including two pivot arms 1311 and two opposite magnetic polarities (a north polarity and a south polarity) at two opposite sides 1312 and 1313. The pivot arms 1311 extend perpendicularly outwards from a center of the first magnet 131. The first magnet 131 is rotably attached to the side sidewalls 125 of the transparent protection structure 12 by inserting each of the pivot arms 1311 in the pivot hole 126 of the transparent protection structure 12 correspondingly. Each of the second magnets 132 is fixed in one of the mounting holes 118 of the housing 113 and an exposed surface 1321 of the second magnet 132 faces away from the ledge 1171 of the stepped depression 117.

In use, when mounting the transparent protection structure 12, the first magnet 131 is rotated such that the side 1311 of the first magnet 131 facing the second magnet 132 is of an opposite polarity corresponding to the exposed surface 1321 of the second magnet 132, thus creating a magnetic force attracting the transparent protection structure 12. When detaching the transparent protection structure 12, the first magnet 131 is rotated such that the opposite side 1313 of the first magnet 131 facing the second magnet 132 is of a same polarity corresponding to that of the second magnet 132, thus creating a magnetic force repelling the transparent protection structure 12. Thus the transparent protection structure 12 is easy to detach from the housing 113 by rotating the first magnet 131

Figure 4:
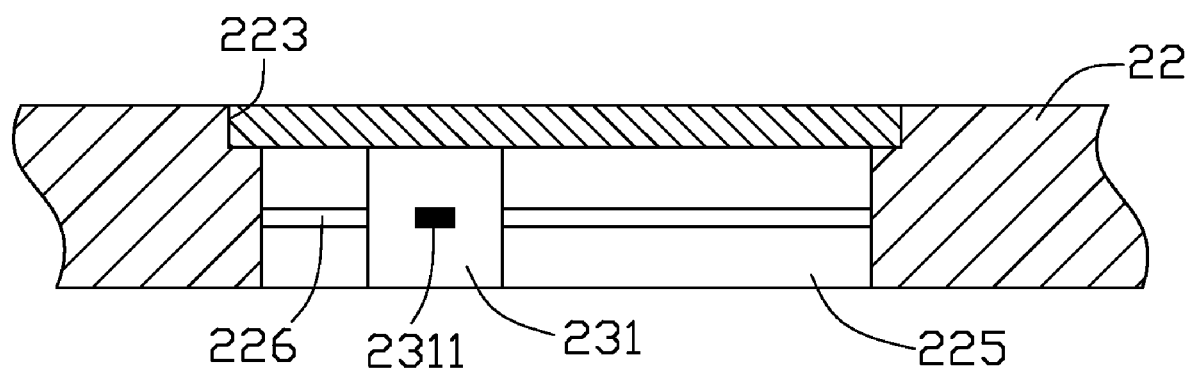
FIG. 4 is an enlarged, cross-sectional view of part of a transparent protection structure of a display device in accordance with a second preferred embodiment of the present invention.

Referring to FIG. 4, a transparent protection structure 22 of a display device (not shown) according to a second embodiment is shown. The transparent protection structure 22 in the second embodiment is similar in principle to the transparent protection structure 12 in the first embodiment. The transparent protection structure 22 defines a channel 223. The transparent protection structure 22 includes two sidewalls 225 disposed at opposite sides of the channel 223. The sidewalls 225 are parallel to each other, and each of the sidewalls 225 defines a sliding groove 226. A first magnet 231 is movably attached in the channel 223. The first magnet 231 includes two sliding arms 2311 respectively extending perpendicular outwards from a center. The pivot arms 2311 are configured for sliding in the sliding grooves 226.

In use, when mounting the transparent protection structure 22 to a housing of the display device, the first magnet 231 is moved to a position corresponding to a second magnet (not shown), thus the transparent protection structure 22 is attracted by a magnetic force. When detaching the transparent protection structure 22 the first magnet 231 is moved away from the position corresponding to the second magnet, thus the transparent protection structure 22 is also easy to detach from the housing.

Figure 5:
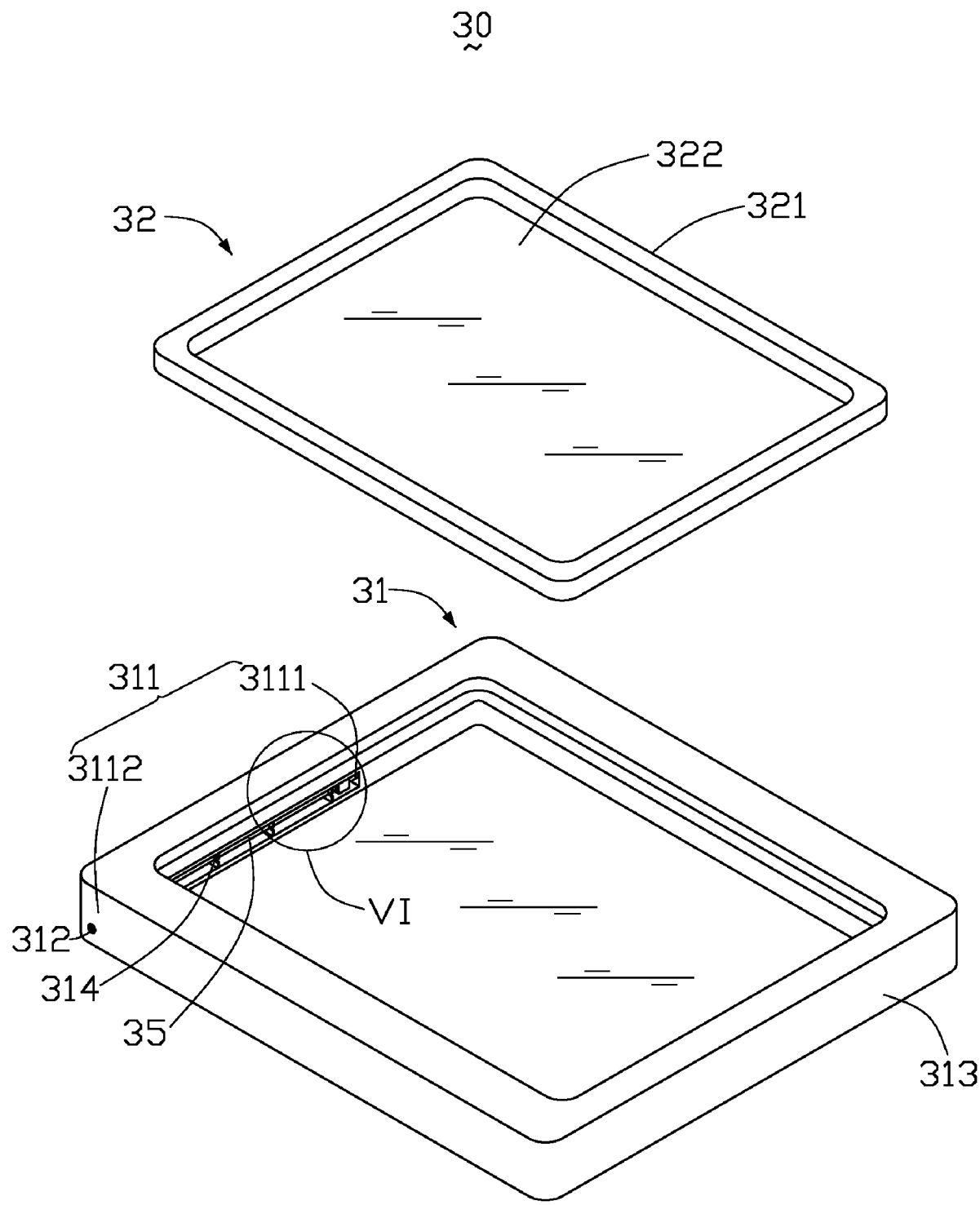
FIG. 5 is a partially exploded view of a display device in accordance with a third preferred embodiment of the present invention.
Figure 6:
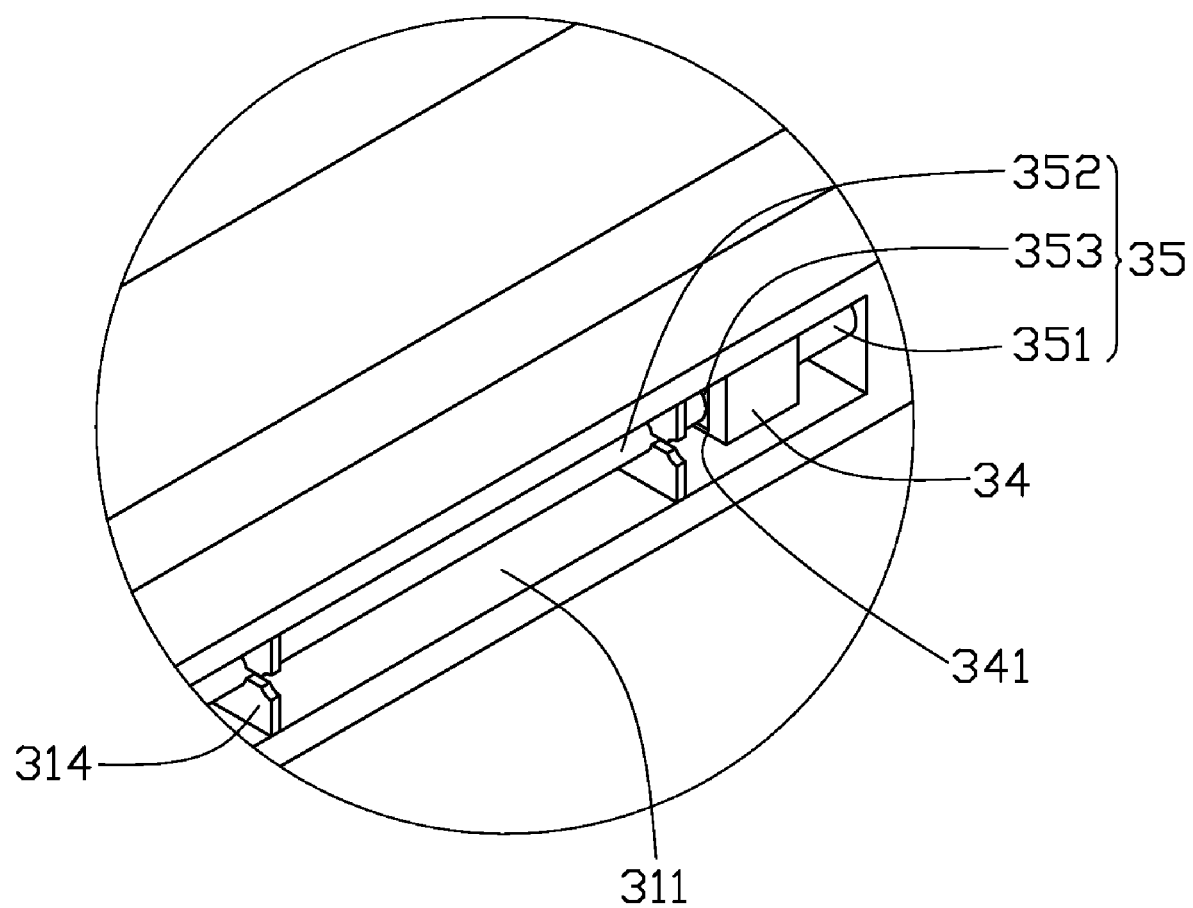
FIG. 6 is an enlarged view of a circled portion VI of FIG. 5.

Referring to FIGS. 5 and 6, a display device 30 according to a third embodiment is shown. The display device 30 includes a display module 31, a transparent protection structure 32, a first magnet (not shown), a second magnet 34, and a rotatable shaft 35. The display module 31 includes a housing 313 and a display panel (not labeled). The housing 313 is substantially a rectangular housing and defines a side groove 311 in a sidewall thereof. A first end portion 3111 and a second end portion 3112 are formed at two opposite ends of the side groove 311. The first end portion 3111 defines a circular groove (not shown), and the second end portion 3112 defines a pivot hole 312. The pivot hole 312 extends through the second portion 3112. A support element 314 is disposed in the side groove 311.

The transparent protection structure 32 includes a frame 321 and a transparent protection plate 322. The first magnet is fixed in the frame 321.

The second magnet 34 defines a mounting hole 341 through a middle portion of the second magnet 34. In this embodiment, the mounting hole 341 is a non-circular hole such as a rectangular hole or an elliptical hole.

The rotatable shaft 35 includes a first shaft portion 351, a second shaft portion 352, and an engaging portion 353. The first shaft portion 351, and the second shaft portion 352 are both cylindrical. A cross-section of the engaging portion 353 of the rotatable shaft 35 corresponds to the shape of the mounting hole 341.

In use, the first shaft portion 351 of the rotatable shaft 35 is received in the circular groove of the first end portion 3111. The second shaft portion 352 of the rotatable shaft 35 is received in the side groove 311 and supported by support elements 314. One end of the second shaft portion 352 is rotably inserted in pivot hole 312 of the second end portion 3112. The engaging portion 353 the rotatable shaft 35 is fixedly engaged in the mounting hole 341 of the second magnet 34, thus the second magnet 34 is able to rotate together with the rotatable shaft 35. The transparent protection structure 32 can be fixed to or detached from the housing 313 by rotating the rotatable shaft 35 together with the second magnet 34. When a polarity of the first magnet in the third embodiment faces an opposite polarity second magnet 34, the transparent protection structure 32 can be fixed to the housing 313. When a polarity of the first magnet faces a same polarity of the second magnet 34, the transparent protection structure 32 can be detached from detached from the housing 313.

Figure 7:
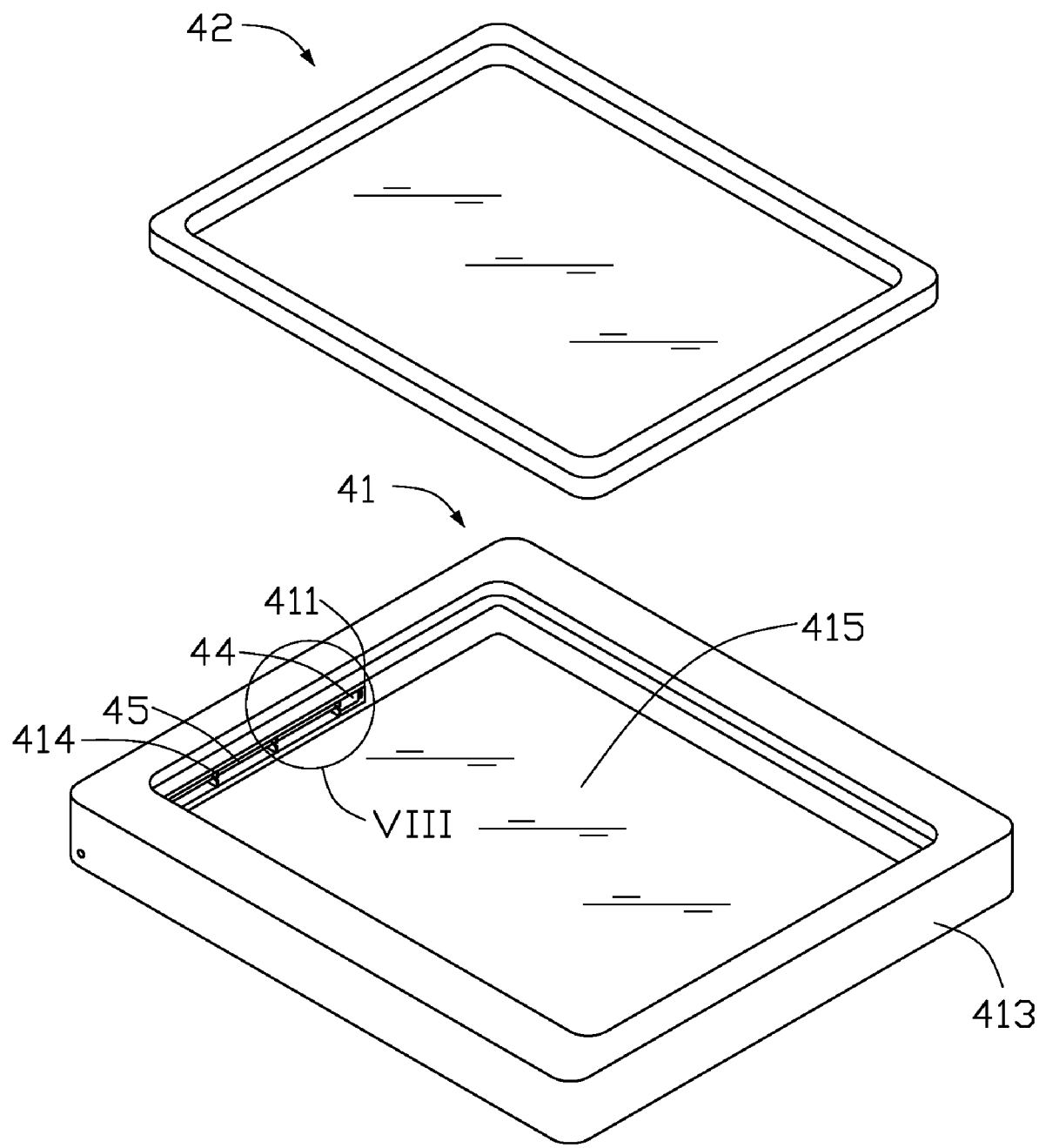
FIG. 7 is a partially exploded view of a display device in accordance with a fourth preferred embodiment of the present invention.
Figure 8:
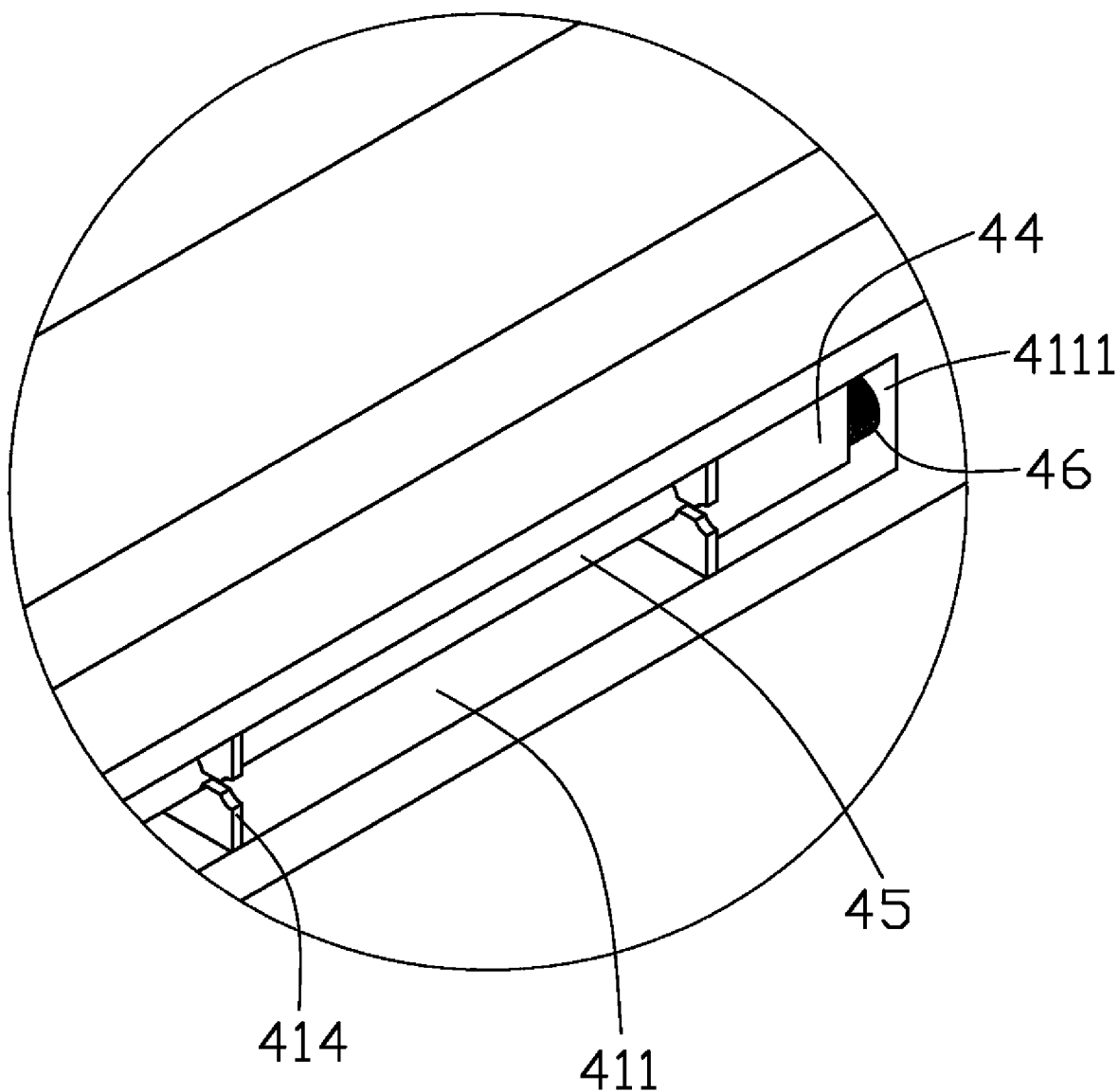
FIG. 8 is an enlarged view of a circled portion VIII of FIG. 7

Referring to FIGS. 7 and 8, a display device 40 according to a fourth embodiment is partially shown. The display device 40 of the fourth embodiment is in a principle similar to the display device of the third embodiment. The display device 40 also includes a display module 41, a transparent protection structure 42, a first magnet (not shown), a second magnet 44, a push shaft 45, and a spring 46. The display module 41 includes a housing 413 and a display panel 415. The housing 413 also defines a side groove 411. A first end portion 4111 and a second end portion (not shown) are formed at two opposite ends of the side groove 411. The first end portion 3111 defines a circular groove (not shown) and the second end portion defines a pivot hole (not shown). One end of the spring 46 is received in the circular groove and an opposite end of the spring 46 abuts the second magnet 44. The push shaft 45 is received in the side groove 411, one end of the push shaft 45 is engaged in the pivot hole of the second end portion, and an opposite end is fixedly connected to the second magnet 44. The push shaft 45 is further supported by at lease one support element 414. The push shaft 45 is movable together with the second magnet 44.

In use, when the second magnet 44 is in an original position corresponding to the first magnet, a polarity of the first magnet facing an opposite polarity of the second magnet 44, thus the transparent protection structure is fixed to the housing 413. If the transparent protection structure needs to detach from the housing, the push shaft 45 is pushed together with the second magnet 44 to compress the spring 46, thus the second magnet 44 is moved away from the original position corresponding the first magnet and the transparent protection structure is detached from the housing 413.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A display panel device, comprising:
   a display module including a housing and a display panel mounted in the housing, and the housing defining at least one mounting hole;
   a transparent protection structure detachably attached to the housing for protecting the display panel, and the transparent protection structure defining at least one channel corresponding to the at least one mounting hole of the housing;

a magnetic latch including at least one first magnet rotably disposed in the at least one channel of the transparent protection structure and at least one second magnet fixed in the at least one mounting hole of the housing, and the at least one first magnet attracting the at least second magnet for fixing the transparent protection structure.

2. The display device as claimed in claim 1, wherein the transparent protection structure includes a frame and a transparent protection plate fixed to the frame.

3. The display device as claimed in claim 2, wherein the transparent protection plate is fixed to the frame by one of double-sided adhesive tape, solid adhesive, and cured glue.

4. The display device as claimed in claim 2, wherein the transparent protection plate is made of a material selected from a group consisting of plastic, glass, and any suitable combination thereof.

5. The display device as claimed in claim 2, wherein the frame includes two parallel sidewalls disposed at opposite sides of the channel, and each of the sidewalls defines a pivot hole, the first magnets including two pivot arms, and the first magnets is rotably attached to the sidewalls of the frame by inserting each of the pivot arms in the corresponding pivot hole.

6. The display device as claimed in claim 1, wherein the channel is a rectangular channel covered by a protection cover, and the protection cover is a rectangular elastic cover.

7. The display device as claimed in claim 1, wherein the housing is a rectangular housing defining a stepped depression, the stepped depression includes a ledge, the at least mounting hole is defined in the ledge, and the transparent protection structure is detachably mounted on top of the ledge.

8. A display panel device, comprising:
a display module including a housing and a display panel mounted in the housing, and the housing defining a side groove;
a transparent protection structure detachably attached to the housing for protecting the display panel;
a magnetic latch including a first magnet fixed in the transparent protection structure and a second magnet corresponding to the first magnet rotably disposed in the side groove of the housing, and the first magnet attracting the second magnet for fixing the transparent protection structure attaching to the housing.

9. The display device as claimed in claim 8, wherein the housing includes a first end portion and a second end portion at two opposite ends of the side groove, the first end portion defines a circular groove and the second end portion defines a pivot hole, the second magnet defines a non-circular mounting hole through a middle portion, the display panel device further includes a rotatable shaft, the rotatable shaft includes a first cylindrical shaft portion received in the circular groove of the first end portion, a second cylindrical shaft portion received in the side groove, and an engaging portion fixedly engaged in the mounting hole of the second magnet, and one end of the second shaft portion is rotably engaged in the pivot hole of the second end portion.

10. A display panel device, comprising:
a display module including a housing and a display panel mounted in the housing;
a transparent protection structure detachably attached to the housing for protecting the display panel;
a magnetic latch including a first magnet disposed in the housing and a second magnet corresponding to the first magnet fixed in the transparent protection structure, a polarity of the first magnet facing a same polarity of the second magnet, and one of the first magnet and the second magnet is movable so that the transparent protection structure being releasable from the housing.

11. The display device as claimed in claim 10, wherein the transparent protection structure includes a frame and a transparent protection plate fixed to the frame.

12. The display device as claimed in claim 11, wherein the transparent protection plate is fixed to the frame by one of double-sided adhesive tape, solid adhesive, and cured glue.

13. The display device as claimed in claim 11, wherein the transparent protection plate is made of a material selected from a group consisting of plastic, glass, and any suitable combination thereof.

14. The display device as claimed in claim 10, wherein the transparent protection structure defines a channel, the transparent protection structure includes two parallel sidewalls at opposite sides of the channel, each of the sidewalls defines a sliding groove, the first magnet includes two sliding arms respectively extending perpendicular outwards from a center, the pivot arms of the first magnet slide in the sliding grooves.

15. The display device as claimed in claim 10, wherein the housing defines a side groove and includes a first end portion and a second end portion formed at two opposite ends of the side groove, the first end portion defines a circular groove, the second end portion defines a pivot hole, the display device further includes a spring a support element, a push shaft, and a spring, the support element is disposed in the side groove, the second magnet defines a mounting hole through a middle portion, the spring having one end of the spring received in the circular groove and an opposite end of the spring abutting the second magnet, and the push shaft includes one end received in the pivot hole of the second end portion and an opposite fixedly connecting to the second magnet.

* * * * *